(12) United States Patent
Huang et al.

(10) Patent No.: US 9,696,391 B2
(45) Date of Patent: Jul. 4, 2017

(54) HIGH SPEED SAMPLE TRANSPORTATION APPARATUS IN A SUPERCONDUCTING MAGNET AND TRANSPORTING METHOD THEREOF

(71) Applicant: Academia Sinica, Taipei (TW)

(72) Inventors: Tai-Huang Huang, Taipei (TW); Ching-Yu Chou, Taipei (TW); Ming-Lee Chu, Taipei (TW); Chi-Fon Chang, Taipei (TW)

(73) Assignee: ACADEMIA SINICA, Taipei (TW)

( * ) Notice: Subject to any disclaimer, the term of this patent is extended or adjusted under 35 U.S.C. 154(b) by 1094 days.

(21) Appl. No.: 13/887,405

(22) Filed: May 6, 2013

(65) Prior Publication Data

US 2013/0342209 A1    Dec. 26, 2013

Related U.S. Application Data

(60) Provisional application No. 61/643,425, filed on May 7, 2012.

(51) Int. Cl.
  *G01R 33/30* (2006.01)
  *G01R 33/44* (2006.01)

(52) U.S. Cl.
  CPC ......... *G01R 33/307* (2013.01); *G01R 33/445* (2013.01)

(58) Field of Classification Search
  CPC ............................ G01R 33/307; G01R 33/445
  See application file for complete search history.

(56) References Cited

U.S. PATENT DOCUMENTS

| | | | | |
|---|---|---|---|---|
| 4,859,949 A | * | 8/1989 | McKenna | G01R 33/307 324/318 |
| 4,981,136 A | * | 1/1991 | Chance | A01K 15/027 324/307 |
| 5,081,991 A | * | 1/1992 | Chance | A01K 15/02 119/700 |
| 7,535,224 B2 | * | 5/2009 | Hu | G01N 24/08 324/307 |
| 9,279,868 B2 | * | 3/2016 | Lohman | G01R 33/282 |

* cited by examiner

*Primary Examiner* — Dixomara Vargas
(74) *Attorney, Agent, or Firm* — Bacon & Thomas, PLLC

(57) ABSTRACT

A precision high-speed shuttle device for transporting samples between different positions of a superconducting magnet with different magnetic field strength is provided. The sample equilibrated at the center of the magnet, where the magnetic field is the highest and homogeneous, is shuttled to a higher position above, where the fringe field is lower, for a defined period of time and shuttled back to the center for detection. By shuttling the sample to different positions in the magnet in different experiments one can obtain a field-dependent profile of particular physical parameters. The position and timing of the sample are precisely under the experimental controlled. In this way various magnetic field-dependent nuclear magnetic resonance (NMR) experiments can be conducted in a single high-field NMR spectrometer.

4 Claims, 6 Drawing Sheets

HIGH SPEED SAMPLE TRANSPORTATION APPARATUS IN A SUPERCONDUCTING MAGNET AND TRANSPORTING METHOD THEREOF

BACKGROUND OF THE INVENTION

Field of the Invention

The exemplary embodiment(s) of the present invention relates to a transportation apparatus and a method thereof. More specifically, the exemplary embodiment(s) of the present invention relates to a high speed sample transportation apparatus in a superconducting magnet and transporting method thereof.

Description of Related Art

In recent years, the issue for transporting samples between different positions of a superconducting magnet with different magnetic field strength has been discussed. Alfred G. Redfield provided a field cycling device by pneumatic control in 2003 (A. G. Redfield, Shuttling device for high-resolution measurements of relaxation and related phenomena in solution at low field, using a shared commercial 500 MHz NMR instrument, Magnetic Resonance in Chemistry, 41 (2003) 753-768.). This design used the abrupt air pressure change to shuttle the sample inside a long glass tube. The sample stop by colliding with an O-ring buffered stopper. The pneumatic design can achieve higher speed but at the expense of system instability due to abrupt start-stop mechanism. Samples are subjected to large g-forces in short time that generate mechanical instability causing sample bubbling and degradation.

Also, Alfred G. Redfield provided a mechanical design in 2012 (A. Redfield, High-resolution NMR field-cycling device for full-range relaxation and structural studies of biopolymers on a shared commercial instrument, Journal of Biomolecular NMR, 52 (2012) 159-177). This design employs an externally mounted mechanical motor, coupled with a long rod, to move the sample up-down the magnet. Even though this prior art employed motor power as driving force, the pulleys and transmission mechanism are all mounted outside of the magnet. Thus, it requires large space above the magnet for installation. In addition, a long rod that holds the sample tube oscillating during and after the shuttling. The oscillation of the rod causes sample to vibrate in magnetic field. For applications that require precise magnetic field, additional waiting time is needed before any test can be started.

Thus, for the demand, designing a high speed sample transportation apparatus in a superconducting magnet and transporting method thereof for effectively transporting a sample in a superconducting magnet has become an important issue for the application in the field.

SUMMARY OF THE INVENTION

A precision high-speed shuttle device for transporting samples between different positions of a superconducting magnet with different magnetic field strength is provided. The sample equilibrated at the center of the magnet, where the magnetic field is the highest and homogeneous, is shuttled to a higher position above, where the fringe field is lower, for a defined period of time and shuttled back to the center for detection. In one of applications, nuclear magnetic resonance (NMR) study, this scheme allowed the detection of NMR spectra of the samples with high sensitivity and resolution associated with higher magnetic field while is able to monitor the changes taking place at lower magnetic field position. By shuttling the sample to different positions in the magnet in different experiments one can obtain a field-dependent profile of particular physical parameters. The position and timing of the sample are precisely under the experimental controlled. In this way various magnetic field-dependent NMR experiments can be conducted in a single high-field NMR spectrometer.

Please refer to FIG. 1 which is a schematic view illustrating a preferred embodiment of a structure of one typical type of commercial superconducting magnet environment. The shuttle device is assembled onto this magnet to transport the sample along the vertical axis in the magnet. The design achieved the following specifications:

1. Space limitation: All shuttling components are fit inside the magnet with magnetic bore.
2. Material limitation: All materials inside the magnet are nonmagnetic.
3. Precision position control: The sample can be shuttled to a predetermined positioned with a precision of ±0.1 mm.
4. Precision timing control: The sample can be stabilized at a predetermined position with time precision of ±5 ms.
5. Speed requirement: The shuttle can travel a 1.0 m distance within 100 ms.
6. Non-destructive to labile samples: The shuttle start-stop smoothly which minimizes sample denaturation.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Typical Environment to Use the Sample Shuttling Apparatus in This Invention.

Figure 1:
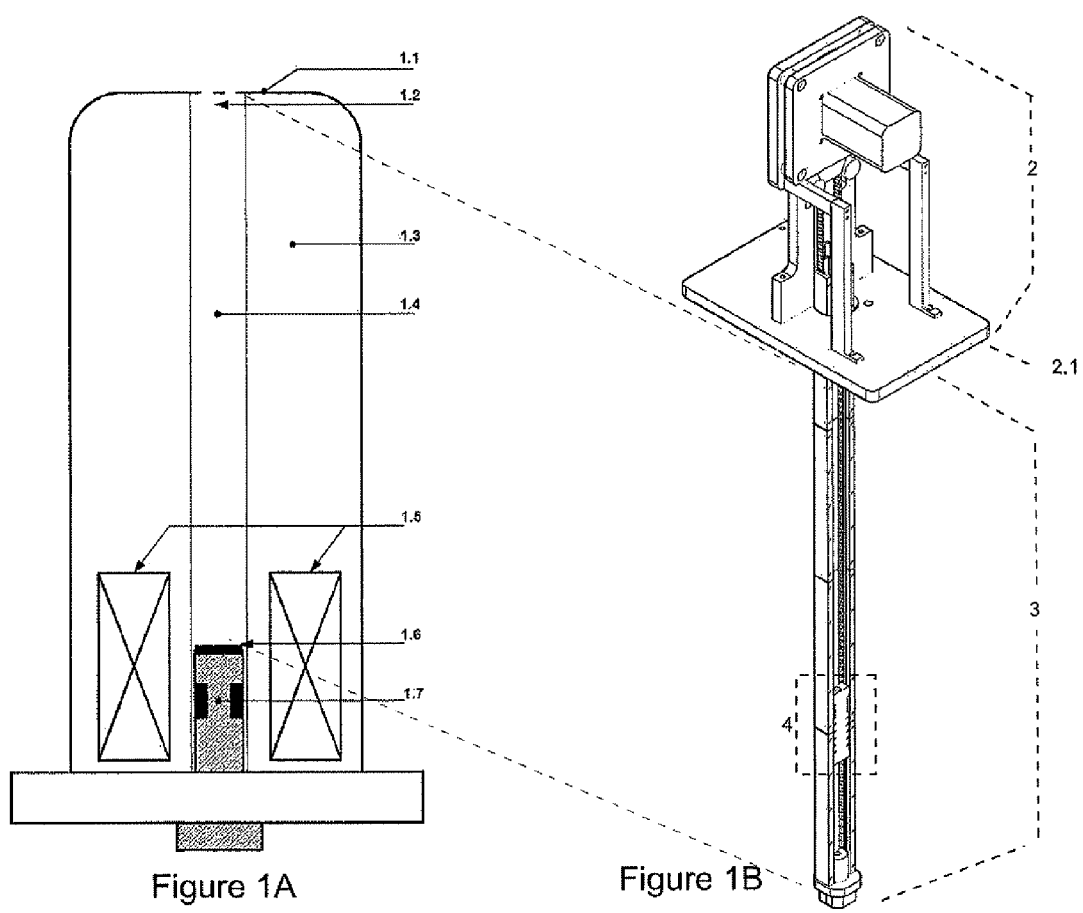
FIG. 1A is a schematic view illustrating a preferred embodiment of a structure of a superconducting magnet environment.
FIG. 1B shows a schematic view illustrating a preferred embodiment of an overall view of a shuttling device according to the present invention.

As in FIG. 1A, a superconducting magnet is a container filled with liquid Helium (1.3). Liquid Helium (1.3) provide cooling to the superconducting coil (1.5). Energized superconducting coil (1.5) produces homogeneous high magnetic field in a limited volume (1.7). Specific sample properties under high magnetic field are evaluated by bringing sample to this high field volume (1.7) to be tested. The shuttle apparatus (FIG. 1B) in this invention is designed to transport the sample for evaluation through the bore entrance (1.2) down to the designated high field volume (1.7) for evaluation. Usually there will be a positional reference (1.6) near the high field volume so any sample transport apparatus can use that reference to position sample precisely.

A Design of a High Speed Sample Shuttle Apparatus That Consists of the Motor Assembly, the Guiding Rail Assembly, and the Shuttle and Sample Tube Holder Assembly.

FIG. 1B shows a schematic view illustrating a preferred embodiment of an overall view of a shuttling apparatus according to the present invention. FIG. 2 to FIG. 6 show the schematic drawings detailed illustrating the parts of FIG. 1B. As shown in FIG. 1B, the embodiment of the shuttling device includes: (i) The motor assembly (2), which is fixed on the horizontal mounting board (2.1). (ii) The guiding rail assembly (3) attached to motor assembly (2) from below of the horizontal mounting board (2.1). (iii) The shuttle (4) carries the sample tube to slide up or down along the designated path on the guiding rail assembly (3). This shutting apparatus (FIG. 1B), when in use, is mounted on top of the superconducting magnet (FIG. 1A), by resting the horizontal mounting board on top of the magnet (1.1). The guiding rail assembly (2) and shuttle and sample are all inside of the magnet bore (1.4). In the following, elements are described in detail.

Figure 2:
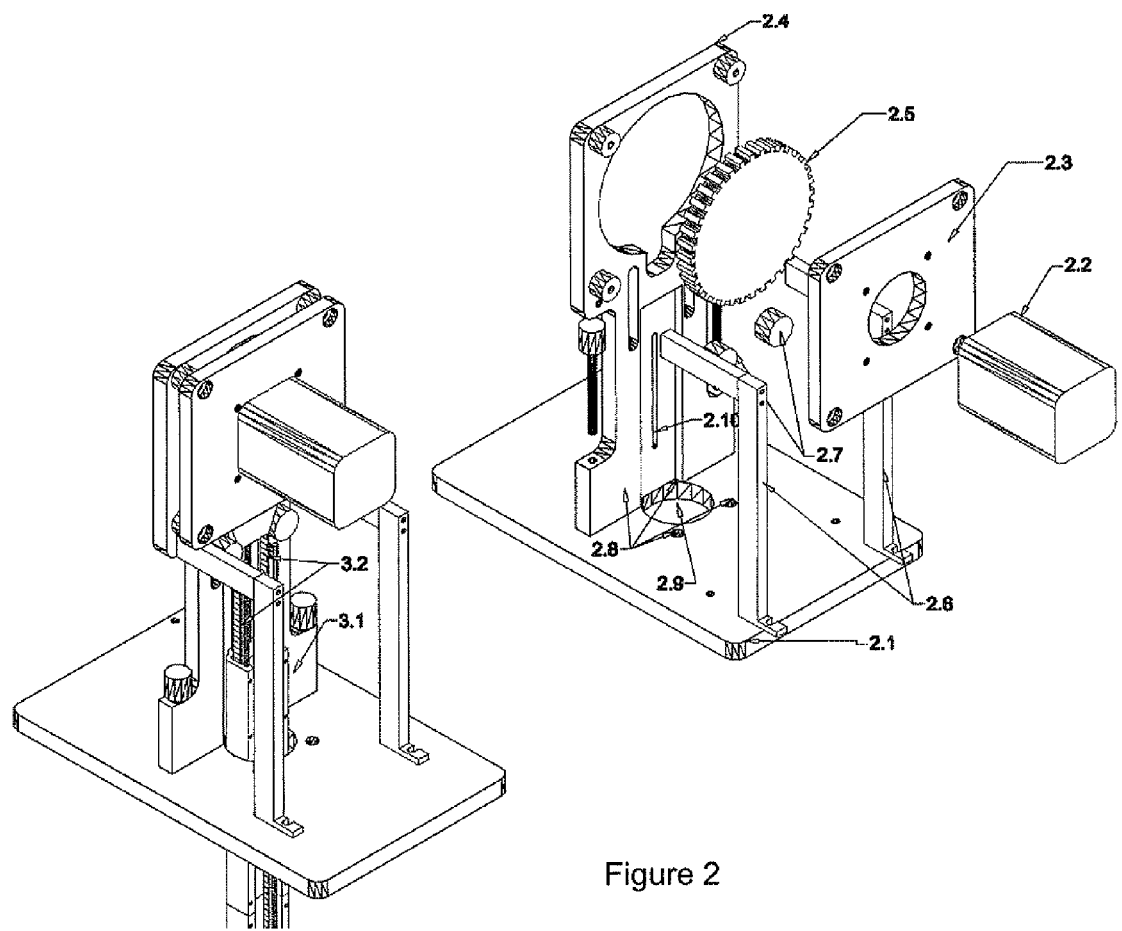
FIG. 2 shows the schematic drawings detailed illustrating the motor assembly of the shuttling device.

The Motor Assembly (FIG. 2).

A servo-motor (2.2) is mounted on a motor mounting plate (2.3). The motor mounting plate (2.3) is mounted on a vertical back plate (2.4). A driving timing pulley (2.5) is fastened directly on the shaft of the motor (2.2), in the space between motor mounting plate (2.3) and vertical back plate (2.4). Two L shaped supports (2.6) provide additional stability for the vertical back plate (2.4). All components in the motor assembly are fastened on the horizontal mounting plate (2.1) which is mounted on top (1.1) of the superconducting magnet. Mounting screws (not shown) are used through the mounting holes (2.8) to fasten the horizontal mounting plate on top of the magnet (FIG. 1A). The opening (2.9) on the horizontal mounting plate (2.3) allow the top rail block (3.1) to place through from below of the horizontal mounting plate (2.3). The slotted hole (2.10) is used to screw fastening of the top rail block (3.1) on to the vertical back plate (2.3). The slotted hole (2.10) allows the rail block vertical position adjustment. Hence provides flexibility to accommodate the length different of the bores of different magnet models. A timing belt (3.2) with proper length loop trough driving timing pulley (2.5) down into the belt tray (3.1.1, see FIG. 3) and loop through the lower timing pulley (3.3.1, FIG. 3) in the far end of the guiding rail assembly (3, FIG. 3). The two idler pulleys (2.7) guide the vertical path of timing belt (3.2) into belt tray (3.1.1) and provide tension adjustment function to the timing belt (3.2).

Figure 3:
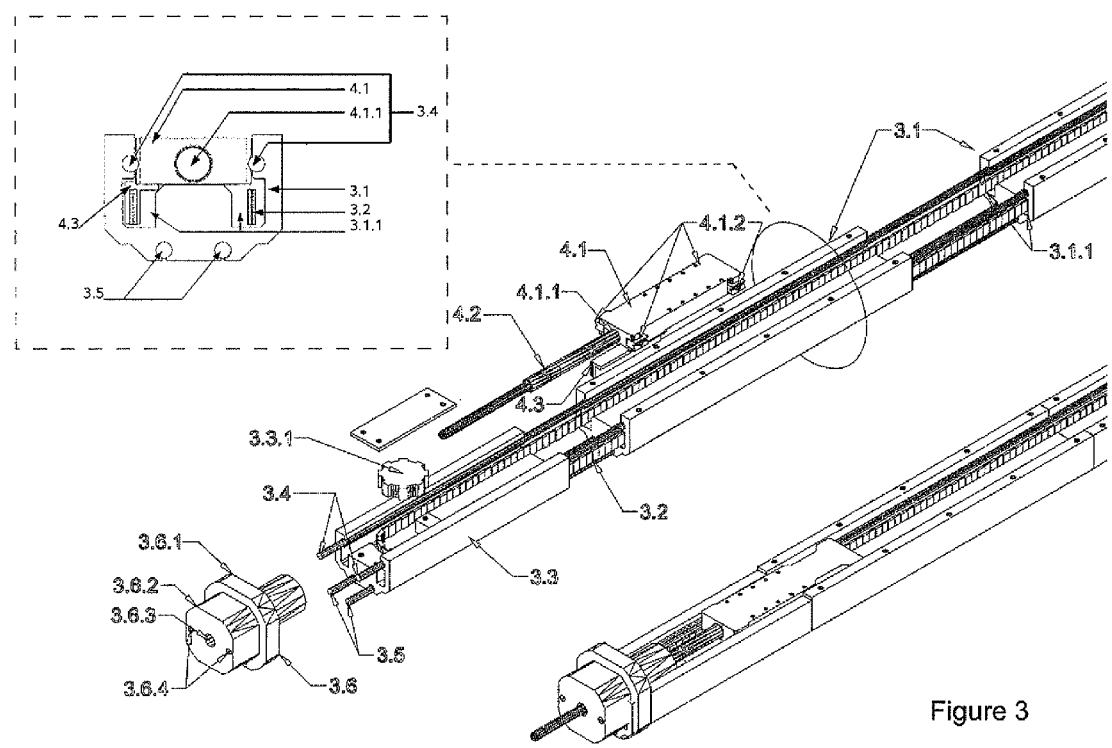
FIG. 3 shows the schematic drawings detailed illustrating the guiding rail assembly of the shuttling device.

Guiding Rail Assembly (FIG. 3).

FIG. 3 illustrates a preferred embodiment showing components of the guiding rail assembly. Several rail blocks (3.1), one lower pulley block (3.3), and one centering flange (3.6) are joined by inserting four long rods (3.4 and 3.5) through each hole on these blocks (3.1, 3.3 and 3.6). All these four long rods (3.4 and 3.5) have screws on both ends (not shown). Screw nuts tighten both ends of all four rods (3.4 and 3.5) with all blocks (3.1.3.3 and 3.6) to form a long straight guiding rail assembly (3, in FIG. 1B). The four rods (3.4 and 3.5) are made with non-magnetic material with smooth surface. All the rail blocks (3.1) have the same cross section as in upper left insert in FIG. 3. Two lower holes hosting two rods (3.5) are functioned to tighten all blocks (3.1, 3.3 and 3.6). The exposed surface of the two guide rods (3.4) in the partially opened holes provides additional function as friction bearing when shuttle (4.1) is placed between these two rods (3.4). The belt tray (3.1.1) allow timing belt (3.2) to run through the length of all rail blocks (3.1). The lower pulley block (3.3) has similar cross section as the rail block (3.1) to accommodate rods (3.4 and 3.5) and timing belt (3.2). In addition, the center of the lower pulley block (3.3) is machined to host a small timing pulley (3.3.1). This small timing pulley (3.3.1) is fastened on a ceramic bearing (not shown) fasten on an axis (not shown) in the lower pulley block (3.3). The lowest length of the timing belt (3.2) rotates through the lower timing pulley (3.3.1) to complete the motion loop. The centering flange (3.6) is designed with respect to position reference (1.6, FIG. 1A) of the superconducting magnet. Edges (3.6.1, 3.6.2) of centering flange (3.6) are designed to fit reference (1.6) design of the magnet. The center hole (3.6.3) of centering flange (3.6) defines entrance of sample to designated sample evaluation volume (1.7, FIG. 1A). The reference holes (3.6.4) for two guide rods (3.4) is designed and machined precisely so to guide the shuttle precisely along the vertical center of magnet bore.

The shuttle apparatus in this invention can be used for sample of different types. The shuttle body and sample tube holder described below are useful for sample which can be placed into a glass tube or samples by itself is solid of similar outer shape as glass tube. In particular, commercial liquid phase sample NMR is one of the common applications to use glass tube as liquid sample container. The sample carrier (the shuttle body (4.1)), and tube holder described below are designed for this type of application.

Figure 4:
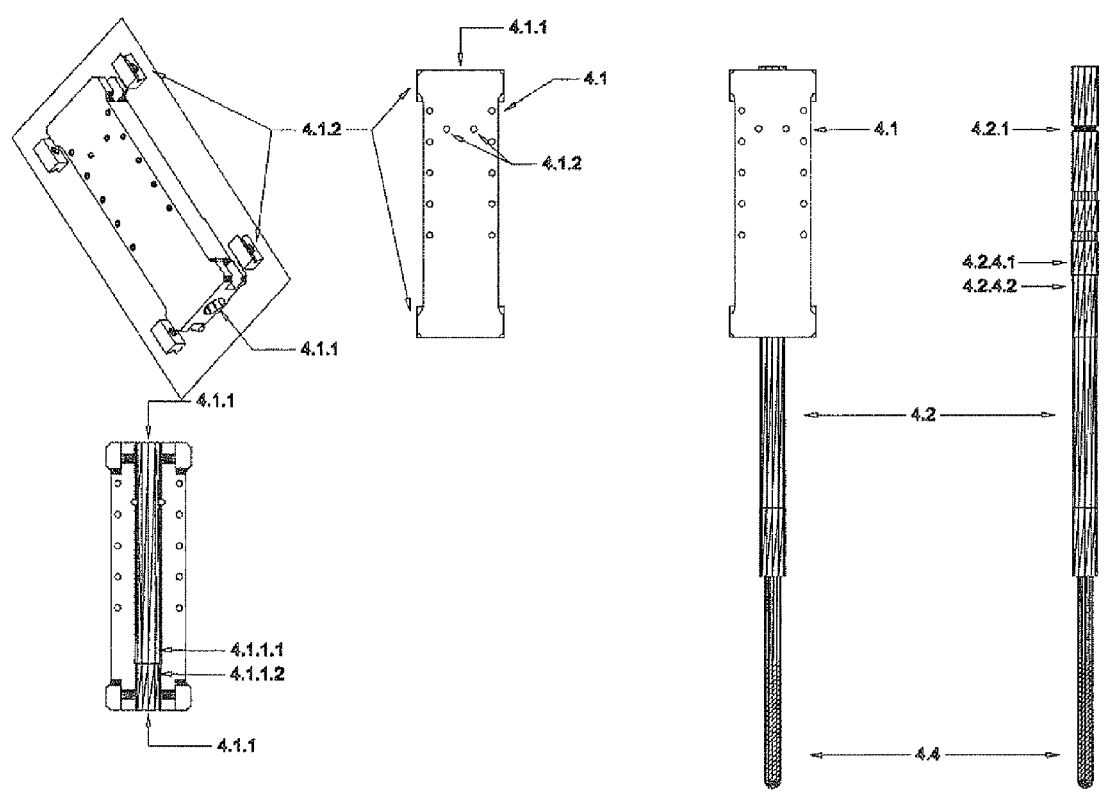
FIG. 4 shows the schematic drawings detailed illustrating the shuttle and the method the shuttle carries the sample holder.
Figure 5:
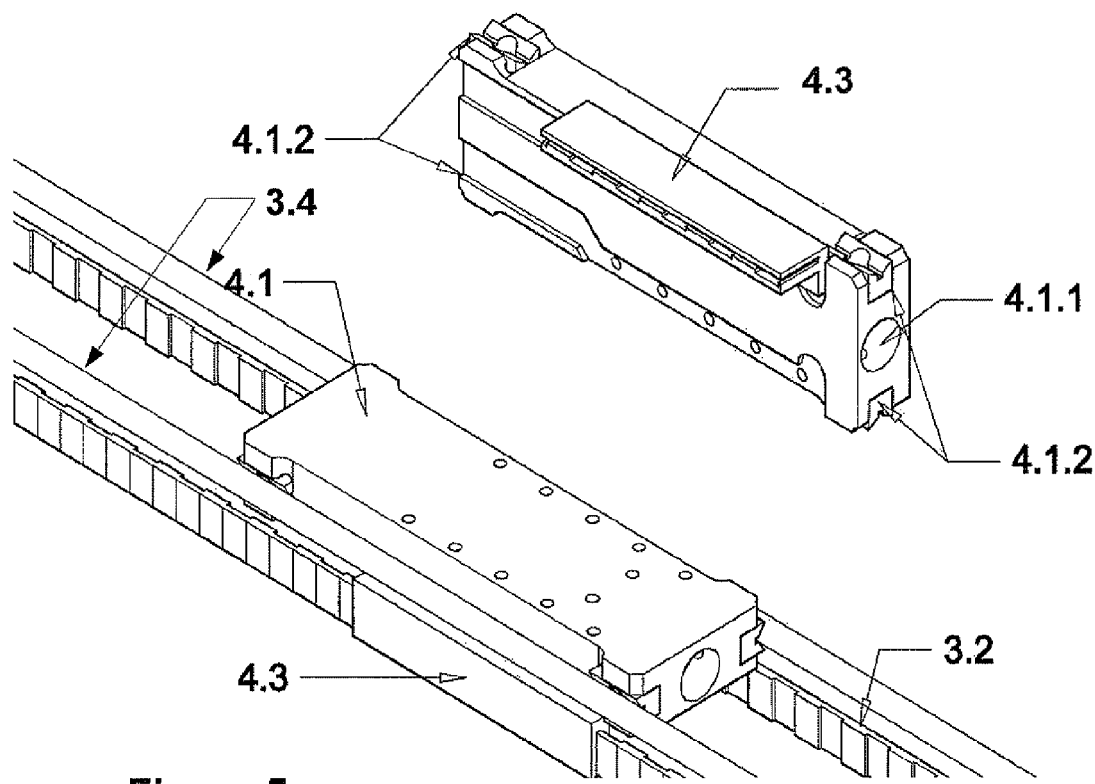
FIG. 5 illustrates the coupling mechanism of the shuttle body to the timing belt.

Shuttle Body (FIG. 4, FIG. 5)

The plastic shuttle body (4.1) is for carrying the sample tube holder (4.2) during traveling along the guide rail assembly. Four replaceable V-grooves (4.1.2) are screw fastened on each corner of the shuttle body (4.1). These V-grooves (4.1.2), when the shuttle body is in between the two guide rods (3.4), directly contact to the two guide rods (3.4). As illustrated in FIG. 5, the V-grooves (4.1.2) and guide rods (3.4) combination form a linear slide allow the shuttle body (4.1) to shuttle smoothly along the center path between the two guide rods (3.4). Non-metal wear-resisting material is required for making these V-grooves. FIG. 5 illustrate the coupling of shuttle body (4.1) to timing belt (3.2) with F-shaped coupler (4.3). See the section view in the lower left of FIG. 4, the center hole (4.1.1) of the shuttle body is used to hold the sample tube holder. The center hole (4.1.1) has two sections (4.1.1.1 and 4.1.1.2) with different diameters. The diameter of lower section (4.1.1.2) is slightly smaller than the diameter of the upper section (4.1.1.1). The sample tube holder (4.2) also has two different outer-diameters. Larger diameter on upper section (4.2.4.1) and smaller diameter on lower section (4.2.4.2). The sample tube holder (4.2) does not fall down from shuttle center hole (4.1.1) by this stepped diameters design. Two small screw holes (4.1.2) on the shuttle body (4.1) are used to screw lock the upper cap (4.2.1) of the tube holder (4.2) to prevent the tube holder to falling out from the top of the center hole (4.1.1).

Figure 6:
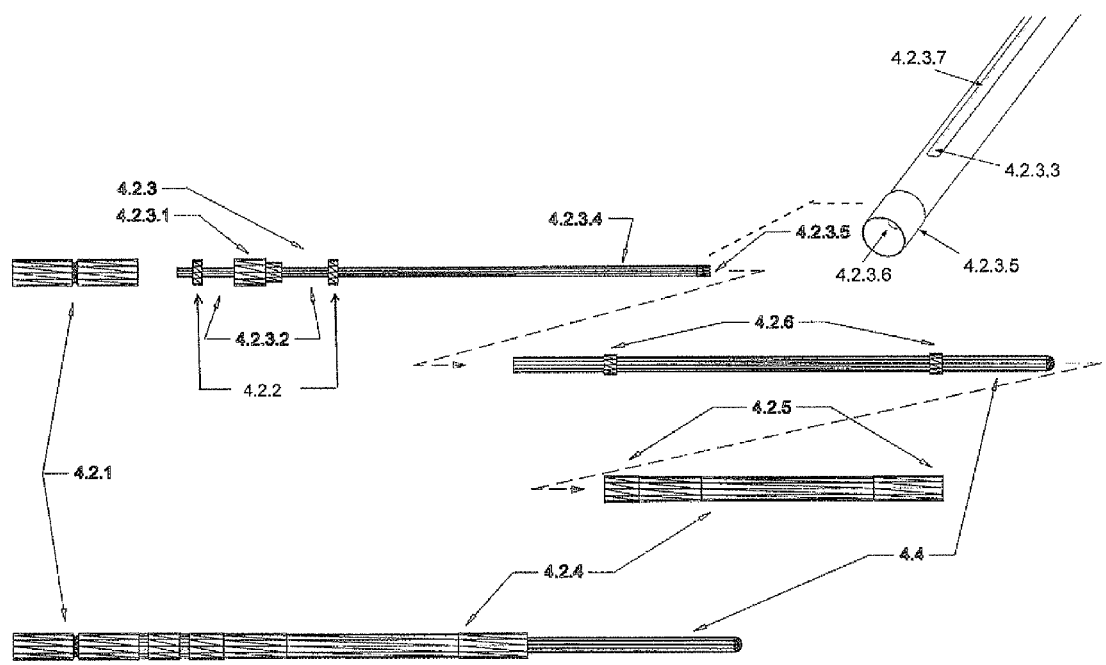
FIG. 6 illustrates a preferred embodiment showing the complete sample tube assembly.

Sample Tube Holder (FIG. 6)

Commercial NMR tubes are made with thin glass which can easily be broken without handled properly. A useful field cycling application requires that a sample to experience an acceleration of up to 30 g (gravity acceleration) to travel 1 meter within 0.1 second (achieved in this invention). Firmly hold the tube without breaking the tube requires careful design in the holding mechanism. The tube holder main body (4.2.4) of the tube holder itself is a tube made of PEEK material. The center hole of the holder main body (4.2.4) has three section of different inner diameter. The middle section of the tube holder main body (4.2.) has inner diameter to just allow sample tube (4,4) to pass through freely. The upper section (4.2.5 not visible) and lower section (4.2.5 not visible) have their inner diameter larger than middle section diameter to allow to insert a tube with additional rubber O-ring (4.2.6) tightly. Hence, when a tube is properly installed in the tube holder, it is held only by two O-rings (4.2.6). In any case, while a tube is experiencing acceleration, the force is always relieved by two O-rings (4.2.6). Apart from the holding of glass tube, the handling of liquid phase sample in tube is also tricky. Major issue is air bubbling. Any gas residual in sample, after experience large acceleration, may stir the liquid sample and cause issues such as foam formation. A flexible tube plug (4.2.3) is designed to confine liquid volume and remove the residual gas. A tube insert (4.2.3.4) is designed to insert into the sample tube and stop when its tip (4.2.3.5) touching the sample liquid surface. A tight fit diameter to the tube inner diameter near the tip (4.2.3.5) to confine the liquid volume. A funnel shape indent on the tip (4.2.3.5) of the tube insert (4.2.3.4) with a small center hole (4.2.3.6). A side hole (4.2.3.3) connecting the center hole (4.2.3.6). And a groove (4.2.3.7) along the length from side hole (4.2.3.3) to the outside of sample tube. This path from tube insert to outside of the tube guide air bubble to escape the sample tube. At the tube insert length outside of the tube is machined as screw (4.2.3.2), a screw nut (4.2.3.1) is used to adjust for proper length of insert so the insert tip can stop at the liquid surface and guide the residual gas bubble out from the funnel indent (4.2.3.7). A top cap (4.2.1) and more O-rings (4.2.2) are used to fix the position of all elements in the tube holder(4.2) when whole tube holder is inside the shuttle body (4.1).

Compared with the prior art of pneumatic design, this invention use software controlled acceleration and de-acceleration instead of stop by impact. The smoother stopping helps to prevent the sample bubbling and degradation. Compare with the prior art of long rod sample attachment, the added height of the shuttle device outside the magnet are largely reduced from greater than 1 meter tall to about 30 cm tall. Also, the moving part, the shuttle, of the present invention, when compare with the long rod and shuttle, is much lighter in weight. The shuttle, when attach to the timing belt, do not have problem cause by the rod oscillation.

Further, the high speed shuttling assembly can be employed in applications where programmable high speed, stable, and precision sample shuttling are needed. Example of applicable areas include field cycling NMR experiments and dynamic nuclear polarization (DNP) spectroscopy.

In NMR experiments, measuring field-dependent parameters such as longitudinal relaxation (T1) and nuclear Overhauser effect (NOE) provide information on sample structure and dynamics. The sample is transported to desired lower fields during relaxation, subsequently transported to high magnetic field position for detection. Such experiment is called "field cycling." The feature of field cycling is that while a field related parameter is measured at low field it retains the advantage of high sensitivity and high resolution grained in high field during detection. The design of the present invention permits the measurements to be made from zero-field to that of the superconducting magnet, thus opens up the possibility of obtaining parameters previously unattainable.

This shuttle device could be applied on shuttle DNP as well. DNP experiments gain sensitivity by transferring electron spin magnetization to the nuclear spin by cross-polarization at low field and detecting the NMR signal at high field. The design of the present invention is an efficient way of transporting sample between the two fields.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A shuttling device for transporting a sample into and out a space inside a superconducting magnet, comprising:
   a base fixed above the superconducting magnet, said base attached to a motor and a driving pulley;
   a rail block extending from the base to the space, and having a belt track along the rail block and a turning pulley at the end of the rail block;
   a flexible belt which is disposed along the belt track and engaged with the driving pulley and the turning pulley; and
   at least two guiding rods adjacently disposed to the belt track having a shuttle capable of holding the sample;
   wherein the shuttle is configured to travel between the at least two guiding rods and is engaged by a coupler with the flexible belt to move the shuttle along the rail block between the space within the superconducting magnet to a zone at or beyond the fringe of the magnetic field.

2. The shuttling device of claim 1, wherein the sample is contained in a tube assembly.

3. The shuttling device of claim 2, wherein the tube assembly comprises a tube holder capable of holding a sample tube with only two O-rings in direct contact with the sample tube.

4. The shuttling device of claim 2, wherein the tube assembly comprises a tube plug with funnel shaped indent on the tip to confine the sample volume and to release residual air bubble in sample.

* * * * *